(12) United States Patent
Kanaoka (10) Patent No.: US 8,691,597 B2
(45) Date of Patent: Apr. 8, 2014

(54) METHOD FOR MANUFACTURING A SEMICONDUCTOR DEVICE INCLUDING APPLICATION OF A PLATING VOLTAGE

(75) Inventor: Taku Kanaoka, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/548,088

(22) Filed: Jul. 12, 2012

(65) Prior Publication Data

US 2013/0084656 A1 Apr. 4, 2013

(30) Foreign Application Priority Data

Sep. 29, 2011 (JP) .................................. 2011-215188

(51) Int. Cl.
*H01L 21/00* (2006.01)
(52) U.S. Cl.
USPC ...... 438/10; 438/687; 438/674; 257/E21.531; 257/E21.175; 257/E21.583; 257/E21.585; 205/83; 205/291
(58) Field of Classification Search
USPC ...................... 205/83, 291; 438/687, 674, 10; 257/E23.161, E21.175, E21.583, 257/E21.585, E21.531
See application file for complete search history.

(56) References Cited

U.S. PATENT DOCUMENTS

| | | | | |
|---|---|---|---|---|
| 5,234,572 A | * | 8/1993 | Uchida et al. .................. | 205/101 |
| 5,969,422 A | * | 10/1999 | Ting et al. ..................... | 257/762 |
| 6,245,676 B1 | * | 6/2001 | Ueno .............................. | 438/687 |
| 6,709,568 B2 | * | 3/2004 | Han et al. ....................... | 205/775 |
| 6,958,113 B2 | | 10/2005 | Mizohata et al. | |
| 7,229,543 B2 | * | 6/2007 | Graham et al. .................. | 205/83 |
| 7,736,474 B2 | * | 6/2010 | Kurashina et al. ............. | 204/223 |
| 2003/0070941 A1 | * | 4/2003 | Hirao .............................. | 205/775 |
| 2005/0173250 A1 | * | 8/2005 | Thies et al. ...................... | 205/83 |
| 2006/0086616 A1 | * | 4/2006 | Kurashina et al. .............. | 205/83 |
| 2006/0183257 A1 | * | 8/2006 | Okubo et al. .................... | 438/17 |
| 2010/0219078 A1 | * | 9/2010 | Kurashina et al. .............. | 205/81 |
| 2011/0117736 A1 | * | 5/2011 | Kanaoka et al. .............. | 438/613 |

FOREIGN PATENT DOCUMENTS

| | | |
|---|---|---|
| JP | 2004-197183 A | 7/2004 |
| JP | 2008-303417 A | 12/2008 |

* cited by examiner

*Primary Examiner* — Marvin Payen
*Assistant Examiner* — Victor Barzykin
(74) *Attorney, Agent, or Firm* — McGinn IP Law Group, PLLC (57) ABSTRACT

An automatic analyzer detects voltage applied across electrodes, and judges whether voltage value falls within set voltage range. When the detected voltage value is lower than minimum value of set voltage range, the analyzer calculates the deficient amount of base solution based on the detected voltage value, controls a valve to supply the deficient amount of base solution, then, performs operation control of the valve so as to keep the prescribed amount of plating solution in plating solution tank, and discharges plating solution. When the detected voltage value is higher than maximum value of set voltage range, the analyzer calculates the excess amount of base solution based on the detected voltage value, controls a valve, and supplies pure water into the tank so that the base solution concentration falls within prescribed range to dilute plating solution, then controls a valve, and discharges plating solution so as to keep prescribed amount.

8 Claims, 10 Drawing Sheets

| | Cl⁻ | Cu²⁺ | H₂SO₄ |
|---|---|---|---|
| CORRELATION COEFFICIENT | −0.943 | −0.65 | −0.194 |
| INTERPRETATION | STRONG CORRELATION OBSERVED | CONSIDERABLE CORRELATION OBSERVED | SLIGHT CORRELATION |

METHOD FOR MANUFACTURING A SEMICONDUCTOR DEVICE INCLUDING APPLICATION OF A PLATING VOLTAGE

CROSS-REFERENCE TO RELATED APPLICATIONS

The disclosure of Japanese Patent Application No. 2011-215188 filed on Sep. 29, 2011 including the specification, drawings and abstract is incorporated herein by reference in its entirety.

BACKGROUND

The present invention relates to a technology for manufacturing a semiconductor device. More particularly, it relates to a technology effective for the formation of a copper plating film by an electroplating device.

In a manufacturing process of a semiconductor device, there is employed a deposition technology in which wirings are formed using an electroplating method. The deposition process referred to as the electroplating method is a process in which copper (Cu) wirings for coupling electronic devices are formed by using an electroplating device.

With the electroplating device, a semiconductor wafer with a cathode arranged thereon is set downwardly with respect to a plating bath, and is immersed in a plating solution. Thus, a voltage is applied to the cathode and an anode arranged in such a manner as to face the semiconductor wafer. This causes a current to flow from the semiconductor wafer peripheral part through a seed film (conductive thin film), thereby to grow a copper plating film on the entire surface of the semiconductor wafer.

During plating deposition, the amount of copper precipitated in the plating solution is determined by the cumulative charge amount. For this reason, voltage control is performed so that the current flowing across anode—cathode becomes constant. Thus, the uniformity of the copper plating film thickness is kept.

For this kind of deposition technology, for example, the following are known: a technology in which during plating deposition of damascene wirings and the like, the bottom-up amount in the wirings, and the amount of impurities included in the copper plating film are kept constant, thereby to suppress the variations in electrical characteristics of the semiconductor device (see, e.g., Patent Document 1); and a technology in which the concentrations of the promoter, the inhibitor, and chlorine in the plating solution are detected, and the promoter concentration, the inhibitor concentration, and the chlorine concentration in the plating solution are set at respective prescribed concentrations, thereby to keep the plating solution with a prescribed concentration (see, e.g., Patent Document 2).

PATENT DOCUMENTS

Patent Document 1

Japanese Unexamined Patent Publication No. 2008-303417

Patent Document 2

Japanese Unexamined Patent Publication No. 2004-197183

SUMMARY

However, the present inventor found that the deposition technology by electroplating in the wiring step of the semiconductor device as described above has the following problems.

As the factor inhibiting the uniformity of the copper plating film thickness, there is the so-called terminal effect. In the pre-step of plating deposition, a seed film acting as a cathode electrode is formed over the semiconductor wafer. The seed film is formed of a metal thin film of copper or the like formed by, for example, a sputtering method.

The terminal effect is the following phenomenon: during plating deposition, due to the voltage drop resulting from the resistance of the seed film, the current amount at the central part of the semiconductor wafer and in the vicinity thereof becomes smaller than in the vicinity of the peripheral part of the semiconductor wafer, and the copper plating film thickness in the vicinity of the central part of the semiconductor wafer becomes smaller than in the vicinity of the peripheral part.

As the measures for reducing the terminal effect, for example, the following technology is known: a high-resistance material such as ceramic is arranged between the anode and the cathode in the plating solution, thereby to substantially increase the plating solution resistance, resulting in the reduction of the voltage drop caused by the resistance of the seed film.

However, when a high-resistance material is arranged in a plating solution, the plating solution resistance increases as described above. For this reason, in order to pass a target current value, a higher voltage becomes required to be applied across the anode and the cathode as compared with the case where a high-resistance material is not arranged.

As a result, a large load is imposed on the anode and the cathode, the power source circuit for generating an application voltage, and like. This reduces the hardware margin, unfavorably causing emergent troubles.

It is an objective of the present invention to provide a technology capable of keeping the uniformity of a copper plating film while reducing the hardware troubles of an electroplating device.

The above and other objectives and novel features of the present invention will become apparent from the following description of the present specification and the accompanying drawings.

Summaries of the representative embodiments of the invention disclosed in the present application will be described in brief as follows.

In accordance with one embodiment, a method for manufacturing a semiconductor device, includes the steps of: preparing a semiconductor wafer including a plug-embedded interlayer insulation film formed thereover; forming an insulation film over the interlayer insulation film; forming a wiring trench in a given region of the insulation film by dry etching; forming a seed film of copper over the insulation film including the wiring trench; forming a copper plating film over the seed film using an electroplating method by an electroplating device; and removing the copper plating film and the seed film in a region except for the wiring trench, and forming a wiring of the copper plating film embedded in the wiring trench.

Then, in the step of forming the copper plating film by the electroplating device, when the semiconductor wafer is immersed in a plating solution to form a copper plating film, the plating voltage applied across an anode and a cathode is detected. Then, it is determined whether or not the detected plating voltage falls within the preset set voltage range.

In the determination results, when the plating voltage is higher than the upper limit value of the set voltage range, the concentration of an inorganic component in the plating solution is adjusted so that the voltage value of the plating voltage falls within the set voltage range.

Further, another summary of the present application will be shown in brief.

In accordance with another embodiment, in the step of forming a copper plating film by a plating device, when the semiconductor wafer is immersed in a plating solution to form a copper plating film, the concentration of an inorganic component in the plating solution is detected. Then, it is determined whether or not the concentration of the inorganic component falls within the preset set concentration range.

In the determination results, when the concentration of the inorganic component does not fall within the set concentration range, there is performed control of adjusting the concentration of the inorganic component in the plating solution so as to fall within the set concentration range.

The effects obtainable by representative embodiments of the invention disclosed in the present application will be described in brief as follows.

It is possible to improve the uniformity of the copper plating film while reducing hardware troubles of the electroplating device.

DETAILED DESCRIPTION

Below, embodiments of the present invention will be described in details by reference to the accompanying drawings. Incidentally, in all the drawings for illustrating the embodiments, the same members are given the same reference signs and numerals in principle. A repeating description thereon will be omitted.

First Embodiment

Figure 1:
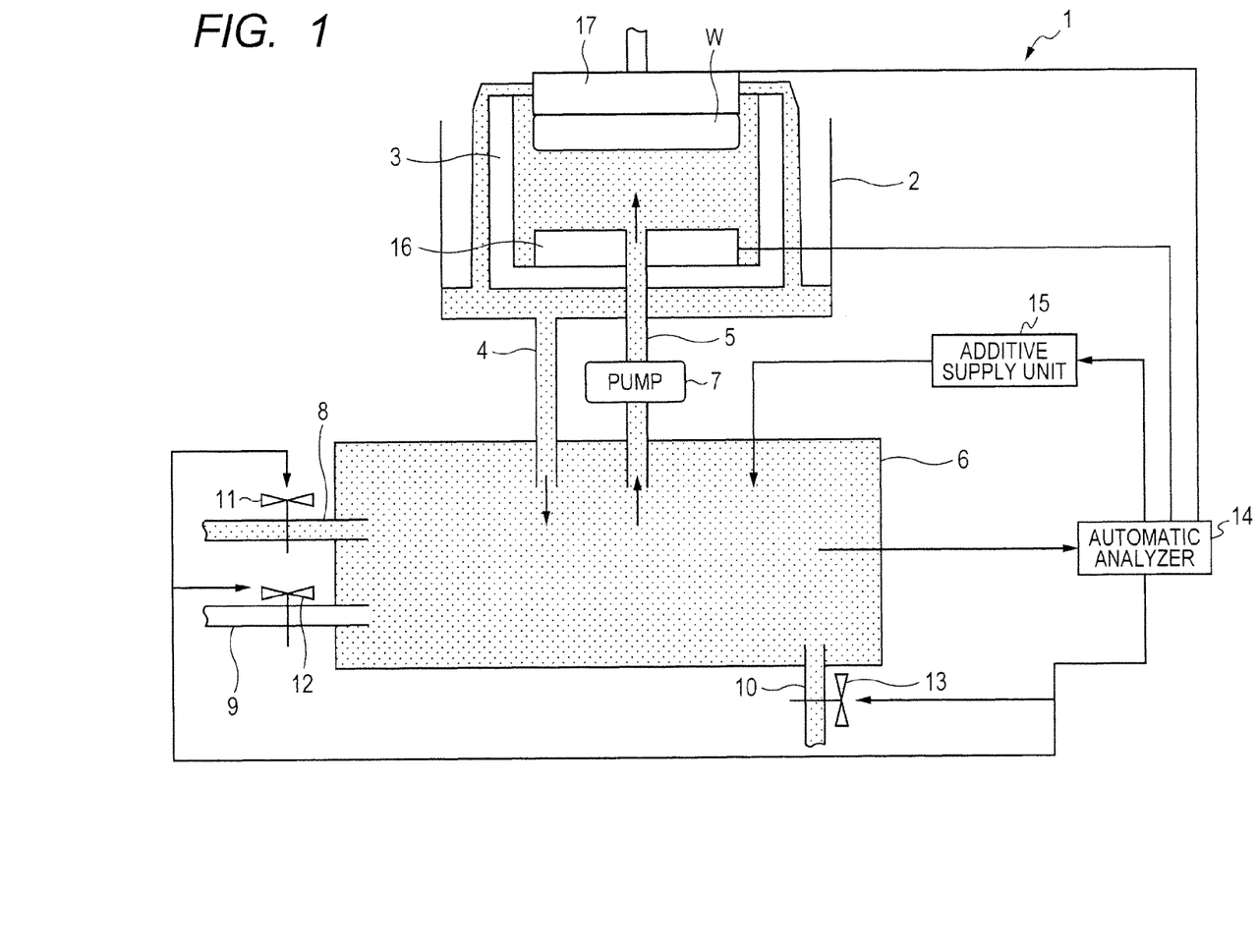
FIG. 1 is an illustrative view showing one example of the configuration in an electroplating device in accordance with a first embodiment of the present invention.
Figure 2:
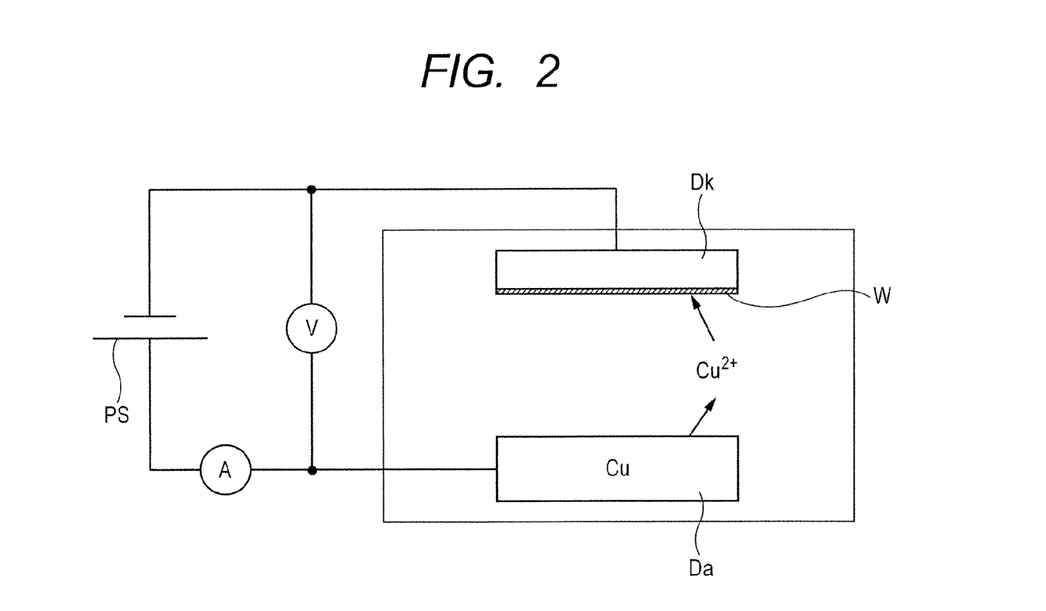
FIG. 2 is an illustrative view of the principle of general copper plating.
Figure 3:
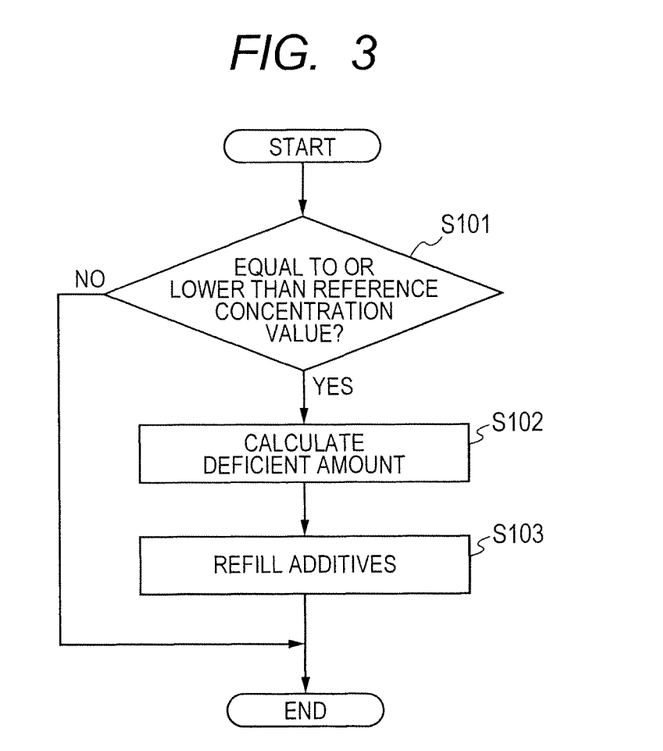
FIG. 3 is a flowchart showing one example of the concentration adjustment treatment of additives in a plating solution by an automatic analyzer arranged in the electroplating device of FIG. 1.
Figure 4:
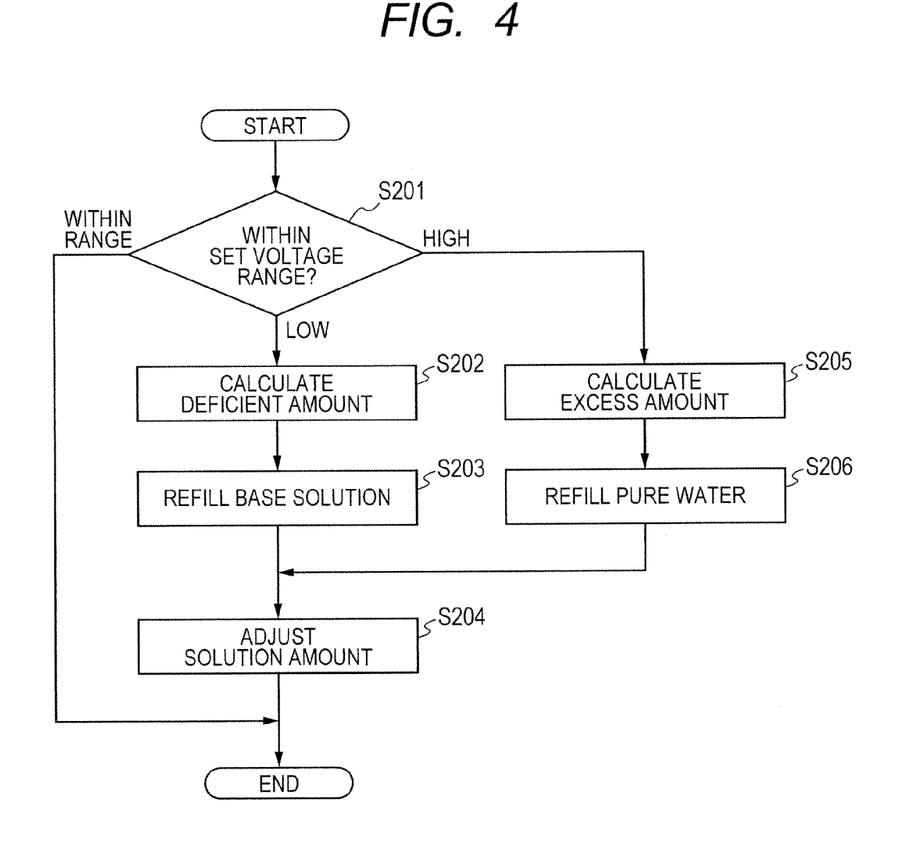
FIG. 4 is a flowchart showing one example of the concentration adjustment treatment of the base solution in the plating solution by the automatic analyzer arranged in the electroplating device of FIG. 1.
Figure 5A:
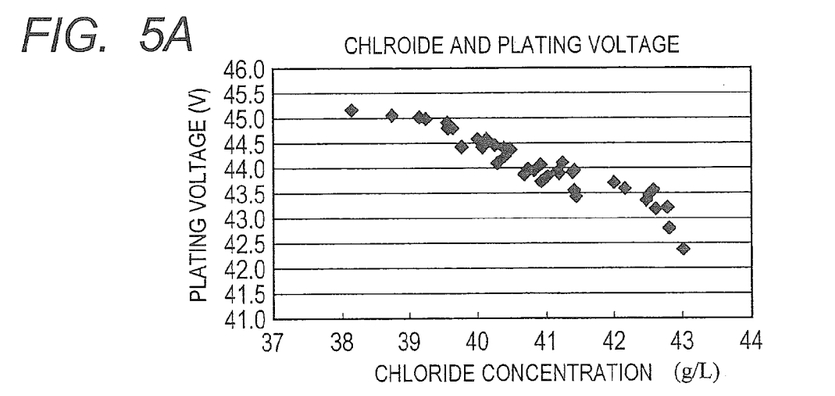
FIGS. 5A to 5C are each an illustrative view showing one example of the correlation between each inorganic component forming the base solution and the plating voltage applied across electrodes of the electroplating device.
Figure 5B:
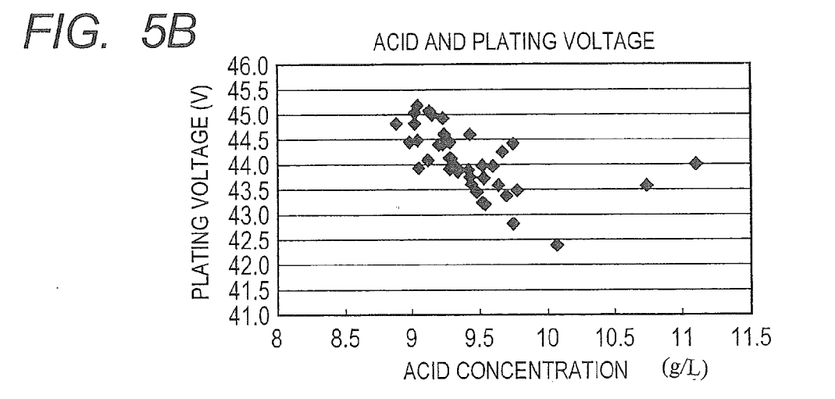
Figure 5C:
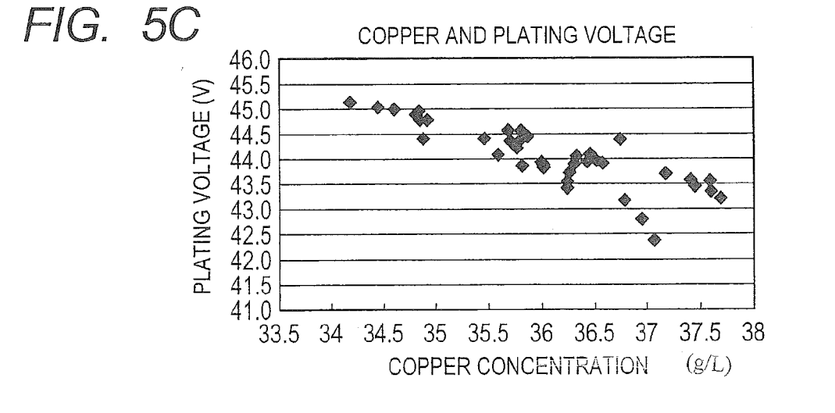
Figure 6:
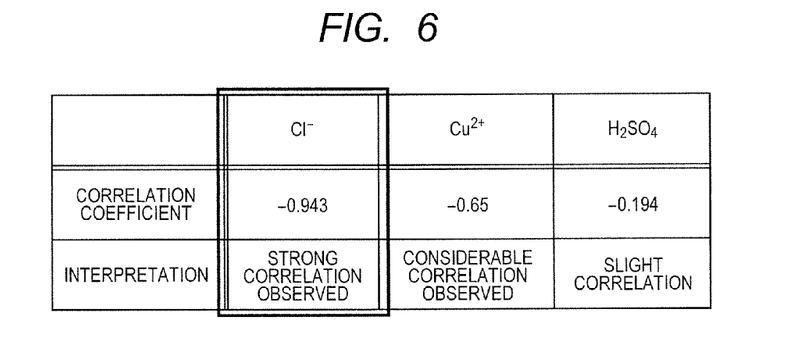
FIG. 6 is an illustrative view of the Pearson's product-moment correlation coefficient determined based on the results of FIGS. 5A to 5C.
Figure 7:
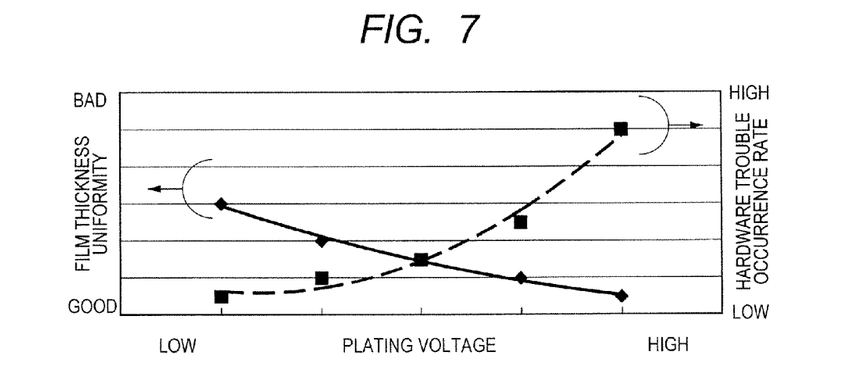
FIG. 7 is an illustrative view showing respective one examples of the correlations between the plating voltage and the film thickness uniformity, and between the plating voltage and the hardware troubles of the electroplating device.
Figure 8:
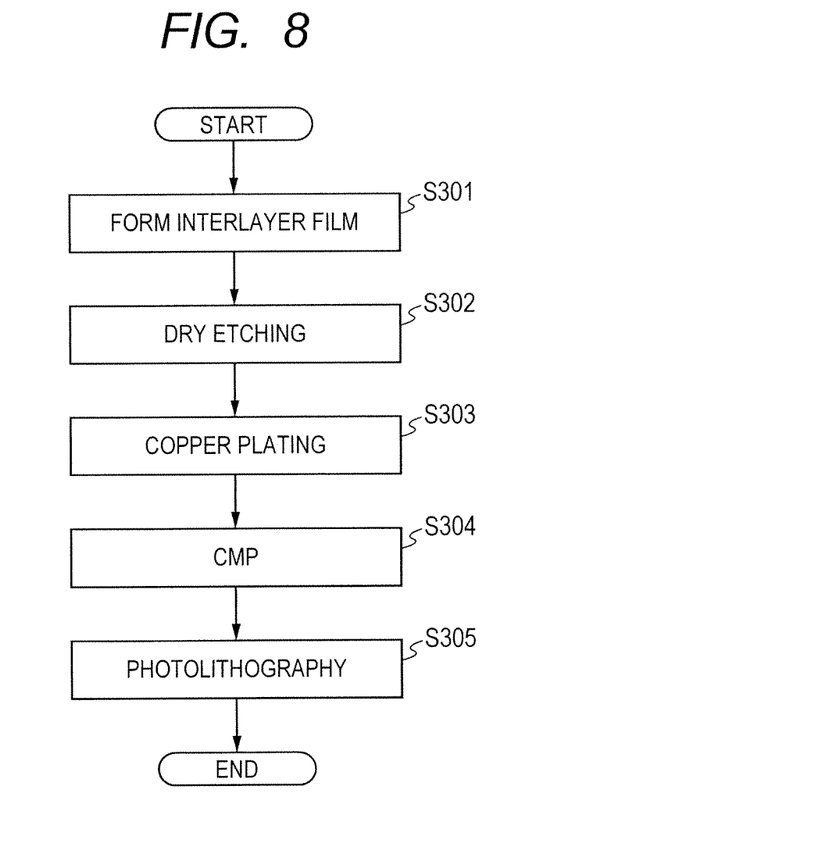
FIG. 8 is a flowchart showing one example of the copper wiring process using the electroplating device of FIG. 1.
Figure 9:
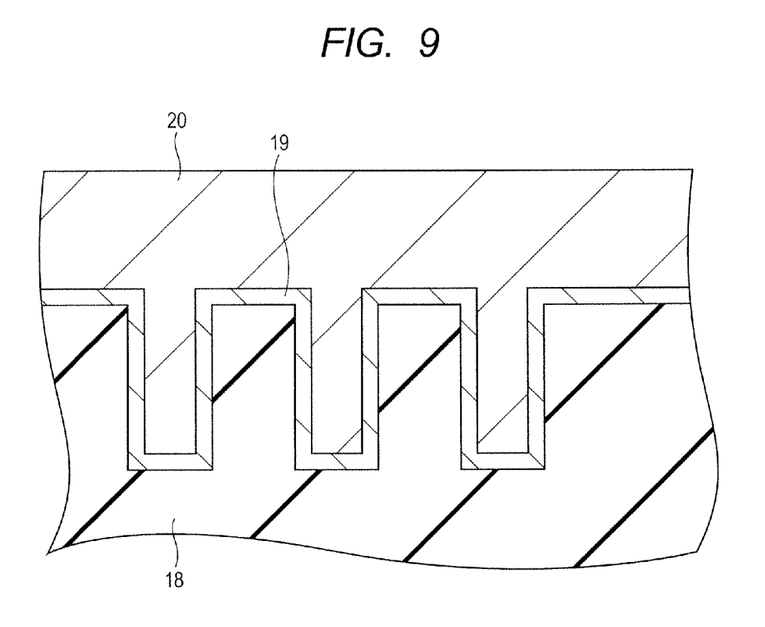
FIG. 9 is a cross-sectional view in the wiring layer upon performing the treatment of the step S304 in FIG. 8.

FIG. 1 is an illustrative view showing one example of the configuration in an electroplating device in accordance with a first embodiment of the present invention. FIG. 2 is an illustrative view of the principle of general copper plating. FIG. 3 is a flowchart showing one example of the concentration adjustment treatment of additives in a plating solution by an automatic analyzer arranged in the electroplating device of FIG. 1. FIG. 4 is a flowchart showing one example of the concentration adjustment treatment of the base solution in the plating solution by the automatic analyzer arranged in the electroplating device of FIG. 1. FIGS. 5A to 5C are each an illustrative view showing one example of the correlation between each inorganic component forming the base solution and the plating voltage applied across electrodes of the electroplating device. FIG. 6 is an illustrative view of the Pearson's product-moment correlation coefficient determined based on the results of FIGS. 5A to 5C. FIG. 7 is an illustrative view showing respective one examples of the correlations between the plating voltage and the film thickness uniformity, and between the plating voltage and the hardware troubles of the electroplating device. FIG. 8 is a flowchart showing one example of the copper wiring process using the electroplating device of FIG. 1. FIG. 9 is a cross-sectional view in the wiring layer upon performing the treatment of the step S304 in FIG. 8.

Summary of Embodiment

An exemplary summary of the first embodiment is a method for manufacturing a semiconductor device. The method includes the steps of: preparing a semiconductor wafer (semiconductor wafer W) including a plug-embedded interlayer insulation film formed thereover; forming an insulation film (insulation film 18) over the interlayer insulation film; forming a wiring trench in a given region of the insulation film by dry etching; forming a seed film (seed film 19) of copper over the insulation film including the wiring trench; forming a copper plating film (copper plating film 20) over the seed film using an electroplating method by an electroplating device (electroplating device 1); and removing the copper plating film and the seed film in a region except for the wiring trench, and forming a wiring of the copper plating film embedded in the wiring trench.

Then, in the step of forming a copper plating film by the plating device, when the semiconductor wafer is immersed in the plating solution to form a copper plating film, there is detected the plating voltage applied across an anode (electrode 16) and a cathode (electrode 17).

It is determined whether or not the detected plating voltage falls within the preset set voltage range. In the determination results, when the plating voltage does not fall within the set voltage range, the concentration of each inorganic component (base solution) in the plating solution is adjusted. The adjustment is performed so that the voltage value of the plating voltage falls within the set voltage range.

Below, the embodiment will be described in details based on the foregoing summary.

Configuration of Electroplating Device, and Configuration of Plating Solution

In the first embodiment, the electroplating device 1 is a device for forming a metal film on a substrate such as a semiconductor wafer by a wet method. In the electroplating device 1, as shown in FIG. 1, there is arranged a bathtub-shaped plating chamber 2. In the plating chamber 2, there is arranged a bathtub-shaped plating bath 3.

The plating bath 3 is a bathtub-shaped solution bath for retaining a plating solution in an amount enough to immerse therein the semiconductor wafer W serving as a to-be-treated substrate. The plating chamber 2 collects the plating solution overflowing the plating bath 3.

The plating chamber 2 is coupled with a solution outlet tube 4. The plating bath 3 is coupled with a solution inlet tube 5. The solution outlet tube 4 is a piping for discharging the plating solution overflowed the plating bath 3 and retained in the plating chamber 2 into the plating solution tank 6. The solution inlet tube 5 is provided with a pump 7. The pump 7 supplies the plating solution retained in the plating solution tank 6 into the plating bath 3 through the solution inlet tube 5.

Further, the plating solution tank 6 is provided with a base solution refill tube 8, a pure water refill tube 9, and a solution outlet tube 10, respectively. The plating solution tank 6 is a tank for reserving the plating solution. The base solution refill tube 8 is provided with a valve 11. The base solution refill tube 8 supplies a plating base solution described later into the plating solution tank 6 according to the degree of opening of the valve 11.

The pure water refill tube 9 is provided with a valve 12. The pure water refill tube 9 supplies pure water to the plating solution tank 6 according to the degree of opening of the valve 12. The solution outlet tube 10 is provided with a valve 13. The solution outlet tube 10 discharges the plating solution retained in the plating solution tank 6 according to the degree of opening of the valve 13.

Herein, a description will be given to the plating solution for use in the electroplating device 1.

The plating solution for performing deposition of copper on the semiconductor wafer W is a liquid of a mixture of the above-described base solution and additives. The base solution includes inorganic substances such as copper sulfate ($CuSO_4$) serving as the raw material for a copper film, sulfuric acid ($H_2SO_4$) serving as an electrolyte, and hydrochloric acid (HCl) for enhancing adsorption of the inhibitor included in additives described later.

Whereas, the additives include organic substances of a promoter such as sulfopropyl disulfide, an inhibitor such as polyethylene glycol, a smoothing agent such as a nitrogen compound, and the like.

The promoter promotes the copper film growth, and improves the filling performance. The inhibitor inhibits the copper film growth, and, for example, prevents the blockage of the pattern opening in the semiconductor wafer W. The smoothing agent suppresses the copper film growth, and improves the flatness of the copper film growth.

Further, the plating solution tank 6 is coupled with an automatic analyzer 14. The automatic analyzer 14 performs the component analysis of the plating solution (base solution and additives) retained in the plating solution tank 6, and, based on the results, controls an additive supply unit 15, and the valves 11 to 13 coupled to the automatic analyzer 14.

The additive supply unit 15 supplies additives of various components into the plating solution tank 6 based on the determination results of the automatic analyzer 14. For example, when the automatic analyzer 14 detects that the smoothing agent in the plating solution is insufficient, it outputs a control signal to the additive supply unit 15 so that the smoothing agent is in an optimum amount (optimum concentration). The additive supply unit 15 supplies the smoothing agent into the plating solution tank 6 in response to the control signal.

Whereas, the automatic analyzer 14 monitors the voltage value applied across the electrodes 16 and 17, and, based on the monitor results, performs opening/closing control of the valves 11 to 13 so that the concentration of the base solution is kept within a given set concentration range.

Herein, for the valves 11 to 13, the following is also acceptable: not by the opening/closing control with the automatic analyzer 14, but based on the results calculated by the automatic analyzer 14, a worker opens/closes the valves 11 to 13, so that the concentration of the base solution is kept at a given set concentration.

For example, when the automatic analyzer 14 judges from the detected voltage value that the concentration of the base solution exceeds the upper limit of the set concentration (higher than the set concentration range), the automatic analyzer 14 supplies pure water into the plating solution tank 6, and discharges the plating solution in the plating solution tank 6 so that the plating solution in the plating solution tank 6 is generally constant. Thus, the automatic analyzer 14 performs the operation control of the valves 12 and 13 so that the base solution in the plating solution tank 6 has a given set concentration.

When the concentration of the base solution is equal to or lower than the lower limit of the set concentration (lower than the set concentration range), the automatic analyzer 14 supplies the base solution into the plating solution tank 6, and performs the operation control of the valves 11 and 13 so that the base solution in the plating solution tank 6 has a given set concentration.

Whereas, at the bottom part of the plating bath 3, there is arranged an anode electrode 16. A cathode electrode 17 is arranged in such a manner as to face the electrode 16. The electrodes 16 and 17 are coupled with a power source device including a low current power source for applying a given voltage and the like (not shown).

Further, the electrode 17 is provided with a holding mechanism (not shown) for holding the semiconductor wafer W. When the semiconductor wafer W is held by the holding mechanism, a portion of the seed film formed at the peripheral part of the semiconductor wafer W of the seed film formed at the semiconductor wafer W is coupled with the electrode 17 via an electrical contact.

The seed film is a metal thin film formed at the semiconductor wafer W in the pre-step of plating deposition by the electroplating device 1. For example, a material such as copper is used. The seed film is coupled to the electrode 17 via the contact as described above, and acts as a cathode electrode.

Principle of Copper Plating

Herein, the principle of general copper plating will be described by reference to the illustrative view of FIG. 2.

When two copper electrodes Dk and Da immersed in a copper sulfate solution are applied with a given voltage V from an external power source device PS, the following reaction occurs.

Cathode (copper electrode Dk): $Cu^{2+}+2e^- \rightarrow Cu$ anode (copper electrode Da):

At this time, the amount of copper (Cu) precipitated at the cathode (copper electrode Dk) is determined by the product of the current value flowing across the copper electrodes and the time (quantity of electricity). When copper is deposited over the semiconductor wafer W by copper plating, the electrochemical reaction is used with the copper seed film-coated semiconductor wafer as a cathode.

Concentration Adjustment Example of Additives by Automatic Analyzer

Then, a description will be given to the concentration adjustment technology of the plating solution by the electroplating device 1 of the present embodiment.

FIG. 3 is a flowchart showing one example of the case of performing the concentration adjustment of additives (organic components) in the plating solution by the automatic analyzer 14.

First, the automatic analyzer 14 analyzes the concentrations of respective additives (promoter, inhibitor, and smoothing agent) in the plating solution of the plating solution tank 6, and judges whether or not the concentration of each additive is equal to or lower than the preset reference concentration value (Step S101). Whereas, in the treatment of the Step S101, when the concentration of each additive is higher than the preset reference concentration value, the treatment is completed as it is.

When the concentration of each additive is equal to or lower than the reference concentration value, the automatic analyzer 14 calculates the deficient amount of the additive with a concentration equal to or lower than the reference concentration value (Step S102), and outputs a control signal to the additive supply unit 15. The additive supply unit 15 receives the control signal from the automatic analyzer 14, and feeds the corresponding additive into the plating solution tank 6, and supplies the additive so that the additive concentration is equal to approximately the reference concentration value (Step S103).

Concentration Adjustment Example of Base Solution by Automatic Analyzer

Subsequently, a description will be given to the concentration adjustment technology of the base solution by the automatic analyzer 14 of the electroplating device 1.

FIG. 4 is a flowchart showing one example of concentration adjustment of the base solution (inorganic components) in the plating solution by the automatic analyzer 14.

First, the automatic analyzer 14 detects the voltage (plating voltage) applied across the electrodes 16 and 17, and judges whether or not the voltage value falls within the preset set voltage range (Step S201).

When the detected voltage value is lower than the lower limit value of the set voltage range, the automatic analyzer 14 calculates the deficient amount of the base solution based on the detected voltage value (Step S202), and performs the operation control of the valve 11 so as to supply the deficient amount of the base solution (Step S203).

Subsequently, the automatic analyzer 14 performs the operation control of the valve 13 so that the amount of the plating solution in the plating solution tank 6 is kept at a prescribed amount, and discharges the plating solution in the plating solution tank 6 (Step S204).

Alternatively, in the treatment of Step S201, when the detected voltage value is higher than the upper limit value of the set voltage range, the automatic analyzer 14 calculates the excess amount of the base solution based on the detected voltage value (Step S205), and performs the operation control of the valve 12. Thus, the automatic analyzer 14 supplies pure water into the plating solution tank 6 so that the concentration of the base solution falls within the prescribed range (Step S206), thereby to dilute the plating solution, and then, carries out the treatment of Step S204.

Still alternatively, in the treatment of Step S201, when the voltage (plating voltage) applied across the electrodes 16 and 17 falls within the preset set voltage range, the treatment is completed as it is.

By the treatments up to this point, the concentrations of the inorganic components in the base solution in the plating solution tank 6 are controlled so as to be generally constant.

The treatments of Steps S203, S204, and S206 in FIG. 4 may be carried out at any timing, and, for example, may be carried out every time the copper plating treatment of the semiconductor wafers by the lot is completed. Alternatively, the treatments may be carried out during the copper plating treatment, thereby to perform real-time control.

Relation Between Base Solution of Plating Solution and Plating Electrode

Then, a description will be given to the correlation between the base solution in the plating solution and the plating voltage.

FIGS. 5A to 5C are each an illustrative view showing one example of the correlation between the concentration of each inorganic component forming the base solution and the plating voltage applied across the electrodes 16 and 17.

FIG. 5A is a view showing the correlation between the hydrochloric acid ($Cl^-$) concentration in the plating solution and the plating voltage. FIG. 5B is a view showing the correlation between the sulfuric acid concentration in the plating solution and the plating voltage. FIG. 5C is a view showing the correlation between the copper sulfate ($Cu^{2+}$) concentration in the plating solution and the plating voltage.

As shown, when any of hydrochloric acid, sulfuric acid, and copper sulfate is reduced in concentration, the plating voltage tends to increase. This indicates that an increase or a decrease in inorganic component concentration in the plating solution (control of the inorganic component concentration at a generally constant level) can keep the plating voltage at a generally constant level.

Particularly, for hydrochloric acid, when the concentration of hydrochloric acid is low, the tendency for the plating voltage to increase is strong. From the results of FIGS. 5A to 5C, the results of determination of the Pearson's product-moment correlation coefficients using the following calculation equation are shown in FIG. 6.

[Mathematical Expression 1]

$$\frac{\text{Covariance of Variable X and Variable Y}}{\text{Standard Deviation of Variable X} \times \text{Standard Deviation of Variable Y}}$$

As a result, in the case of hydrochloric acid, the correlation coefficient is, as shown in FIG. 6, about $-0.943$, which reveals that there is a strong correlation. Thus, as described in conjunction with FIG. 4, the following control is performed: the plating voltage is monitored, and the base solution is supplied so that the plating voltage falls within the set voltage range; as a result, the hydrochloric acid concentration in the base solution is kept within the prescribed range.

This can keep the plating voltage generally constant (within the set voltage range). Accordingly, it is possible to reduce the probability of hardware troubles in the electroplating device 1 while improving the plating quality.

Example of hydrochloric acid concentration in base solution

The set voltage range of the plating voltage is, in the case of a semiconductor wafer having a diameter of 300 mm, for example, about 42 V to 45 V. The current value at this time is, for example, a current value as low as about 30 A. Then, in order to set the plating voltage at about 42 V to 45 V, it is essential only that the concentration of the hydrochloric acid (Cl⁻) in the plating solution is kept at, for example, about 40 g/L to 45 g/L.

Correlation Between Plating Voltage and Film Thickness Uniformity/Hardware Troubles:

FIG. 7 is an illustrative view showing respective one examples of the correlations between the plating voltage (the voltage applied across the electrodes 16 and 17) and the film thickness uniformity, and between the plating voltage and the hardware troubles.

In FIG. 7, the abscissa denotes the plating voltage value, and the left-side ordinate denotes the film thickness uniformity. Whereas, the right-side ordinate of FIG. 7 denotes the hardware trouble occurrence rate in a general electroplating device.

As indicated with the solid line of FIG. 7, as the plating voltage increases, the film thickness uniformity of copper plating formed on the semiconductor wafer is improved. Conversely, as the plating voltage decreases, the film thickness uniformity of copper plating tends to be deteriorated.

This is for the following reason: an increase in plating voltage results in the reduction of the terminal effect described in "SUMMARY".

On the other hand, for the plating voltage and the hardware trouble occurrence rate in the electroplating device, as indicated with the dotted line of FIG. 7, as the plating voltage increases, the hardware trouble occurrence rate increases. As the plating voltage decreases, the hardware trouble occurrence rate decreases.

Thus, when the plating voltage is increased to enhance the film thickness uniformity, the frequency of the maintenance (e.g., replacement of electrodes) of the electroplating device is increased in order to prevent hardware troubles. This unfavorably results in an increase in cost, and other problems. Further, when the plating voltage is reduced in order to suppress the increase in cost, the film thickness uniformity of the copper plating film is deteriorated, which may deteriorate the quality of the semiconductor device.

Accordingly, in the electrical copper plating treatment, it is important to set and control the optimum plating voltage in order to keep the film thickness uniformity while preventing hardware troubles of the electroplating device without frequently performing maintenance.

Thus, in the electroplating device 1, as described above, the optimum plating voltage can be controlled by performing the following control: the base solution is supplied so that the plating voltage falls within the set voltage range; as a result, the concentration of hydrochloric acid (Cl⁻) having a strong correlation with the plating voltage is kept within the prescribed range.

Copper Wiring Process Example

Then, the copper wiring process (formation of wiring) using the electroplating device 1 will be described by reference to the flowchart of FIG. 8, and the cross-sectional view of FIG. 9. Further, FIG. 9 shows the cross-sectional view upon performing the treatment of Step S304 in FIG. 8.

Herein, a description will be given to the case where a wiring (wiring layer) which is the first-layer wiring is formed over the plug (not shown)-embedded interlayer insulation film (not shown) by a damascene technology.

First, over a plug-embedded interlayer insulation film, there is formed an insulation film 18 (Step S301). The insulation film 18 can also be formed of a lamination film of a plurality of insulation films.

Subsequently, by dry etching with a photoresist pattern (not shown) as an etching mask, a wiring trench is formed in a prescribed region of the insulation film 18 (Step S302), and then, over the insulation film 18 including over the bottom part and the sidewall of the wiring trench, there is formed a barrier conductive film (e.g., a titanium nitride film, a tantalum film, or a tantalum nitride film).

Then, by a CVD (Chemical Vapor Deposition) method, a sputtering method, or the like, over the barrier conductive film, there is formed a copper seed film (seed layer) 19 (Step S303). Using an electrolytic plating method or the like, over the seed film 19, there is formed a copper plating film 20 (Step S304), and the copper plating film 20 fills the inside of the wiring trench. In the treatment of Step S304, electroplating is performed using the electroplating device 1, thereby to form the copper plating film 20.

Then, portions of the main conductive film (the copper plating film and the seed film) and the barrier conductive film in regions except for the wiring trenches are removed by a CMP (Chemical Mechanical Polishing) method (Step S305). This results in the formation of a first-layer wiring including the copper embedded in the wiring trench as a main conductive material. Incidentally, in FIG. 9, for simplification of the drawing, the barrier conductive film and the seed film are shown in an integral form.

In the manner described up to this point, there is manufactured the wiring in the semiconductor device of the present embodiment.

As a result, in accordance with the present first embodiment, it is possible to form a uniform copper plating while reducing the hardware troubles of the electroplating device 1.

Second Embodiment

Figure 10:
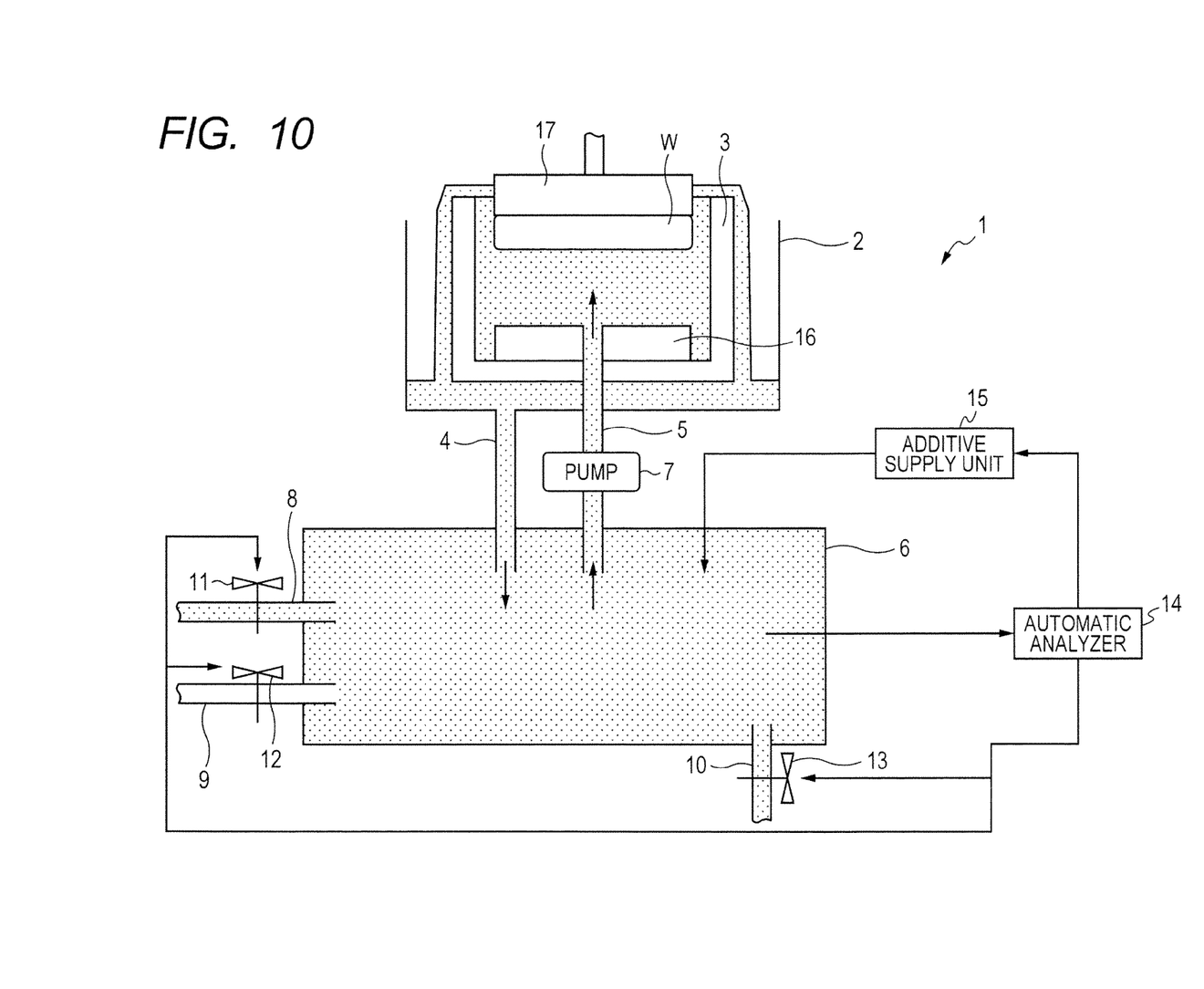
FIG. 10 is an illustrative view showing one example of the configuration in an electroplating device in accordance with a second embodiment of the present invention.
Figure 11:
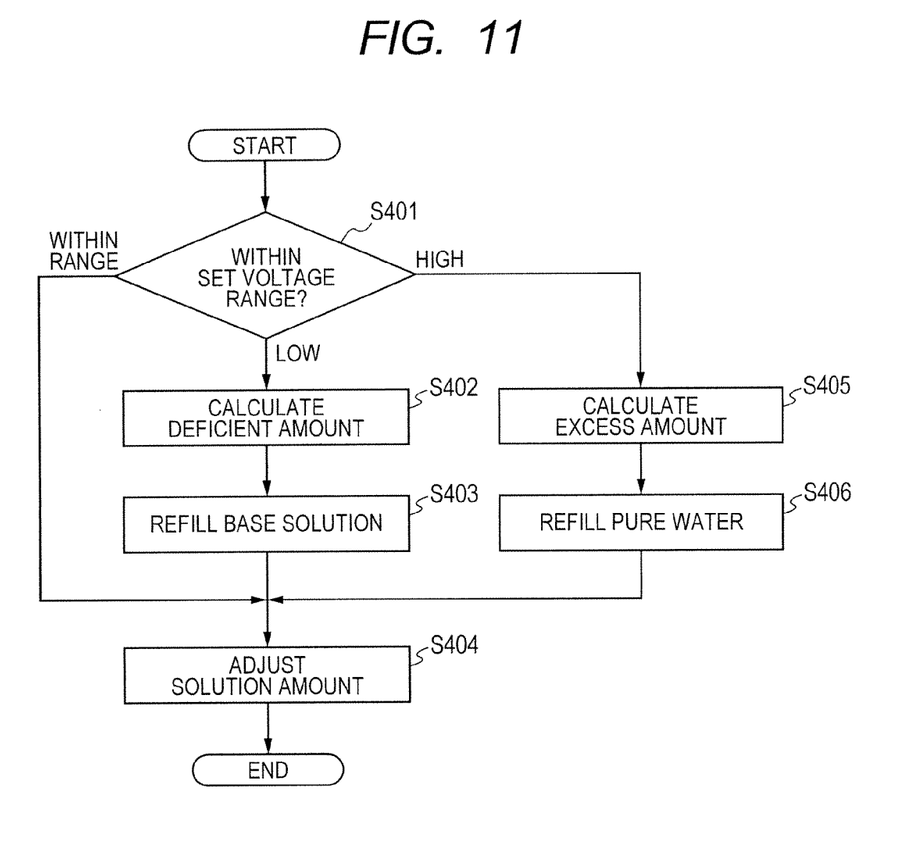
FIG. 11 is a flowchart showing one example of the concentration adjustment treatment of the base solution in a plating solution by an automatic analyzer arranged in the electroplating device of FIG. 10.

FIG. 10 is an illustrative view showing one example of the configuration in an electroplating device in accordance with a second embodiment of the present invention. FIG. 11 is a flowchart showing one example of the concentration adjustment treatment of the base solution in a plating solution by an automatic analyzer arranged in the electroplating device of FIG. 10.

Summary of Embodiment

A second summary of the present embodiment is a method for manufacturing a semiconductor device. The method includes the steps of: preparing a semiconductor wafer (semiconductor wafer W) including a plug-embedded interlayer insulation film formed thereover; forming an insulation film (insulation film 18) over the interlayer insulation film; forming a wiring trench in a given region of the insulation film by dry etching; forming a seed film (seed film 19) of copper over the insulation film including the wiring trench; forming a copper plating film (copper plating film 20) over the seed film using an electroplating method by an electroplating device (electroplating device 1); and removing the copper plating film and the seed film in a region except for the wiring trench, and forming a wiring of the copper plating film embedded in the wiring trench.

Then, in the step of forming a copper plating film by a plating device, when the semiconductor wafer is immersed in the plating solution, thereby to form the copper plating film, the concentrations of inorganic components in the plating solution are detected. Then, it is determined whether or not the concentration of each inorganic component falls within the preset set concentration range.

In the determination results, when the concentration of the inorganic component (hydrochloric acid) does not fall within the set concentration range, the concentration of the inorganic component (base solution) in the plating solution is adjusted so that the concentration of the inorganic component falls within the set concentration range. Thus, the plating voltage is controlled at a generally constant level.

Below, the embodiment will be described in details based on the summary.

In the present second embodiment, the electroplating device 1 includes, as shown in FIG. 10, a plating chamber 2, a plating bath 3, a solution outlet tube 4, a solution inlet tube 5, a plating solution tank 6, a pump 7, a base solution refill tube 8, a pure water refill tube 9, a solution outlet tube 10, valves 11 to 13, an automatic analyzer 14, an additive supply unit 15, and the electrodes 16 and 17. The configuration is the same as that of FIG. 1 of the first embodiment.

The different point from the electroplating device in FIG. 1 of the first embodiment is in the analysis operation in the automatic analyzer 14. In this case, the automatic analyzer 14 of FIG. 10 performs the component analysis of not only the additives in the plating solution but also the base solution, and performs the concentration adjustment of the additives and the base solution based on the analysis results. Accordingly, as shown in FIG. 10, the automatic analyzer 14 is not provided with a mechanism for detecting the voltage (plating voltage) across the electrodes 16 and 17. Incidentally, the concentration adjustment of the additives by the automatic analyzer 14 is the same as the treatment shown in FIG. 3 of the first embodiment.

Then, the concentration adjustment technology of the base solution in the automatic analyzer 14 of the electroplating device 1 in accordance with the present second embodiment will be described by reference to the flowchart of FIG. 11.

First, the automatic analyzer 14 analyzes the concentration of hydrochloric acid ($Cl^-$) in the plating solution of the plating solution tank 6, and judges whether or not the concentration of hydrochloric acid ($Cl^-$) falls within the preset set concentration range (Step S401).

When the concentration of hydrochloric acid ($Cl^-$) is lower than the lower limit of the set concentration range, the automatic analyzer 14 calculates the deficient amount of the base solution based on the detected concentration of hydrochloric acid ($Cl^-$) (Step S402), and performs the operation control of the valve 11. Thus, the following treatment is performed: the deficient amount of the base solution is supplied, so that the concentration of hydrochloric acid ($Cl^-$) in the base solution falls within the set concentration range (Step S403).

Subsequently, the automatic analyzer 14 performs the operation control of the valve 13 so that the amount of the plating solution in the plating solution tank 6 is kept at a prescribed level, and discharges the plating solution in the plating solution tank 6 (Step S404).

Alternatively, in the treatment of Step S401, when the detected hydrochloric acid ($Cl^-$) concentration exceeds the upper limit of the set concentration range, the automatic analyzer 14 calculates the excess amount of the base solution based on the detected hydrochloric acid ($Cl^-$) concentration (Step S405), performs the operation control of the valve 12, and supplies pure water into the plating solution tank 6 so that the concentration of the base solution falls within the prescribed range (Step S406). Then, the treatment of Step S404 is carried out.

Still alternatively, in the treatment of Step S401, when the concentration of hydrochloric acid ($Cl^-$) falls within the set concentration range, the treatment is completed as it is.

By the treatments up to this point, the concentration of the base solution in the plating solution tank 6 is controlled so as to be generally constant.

Incidentally, herein, a description was given to the following case: the concentration of hydrochloric acid ($Cl^-$) is detected, and the base solution is supplied, or pure water is supplied according to the detection results. However, as shown in FIGS. 5B and 5C, there is correlation between the sulfuric acid concentration in the plating solution and the plating voltage, or also between the copper sulfate ($Cu^{2+}$) concentration in the plating solution and the plating voltage. For this reason, the following procedure is also acceptable: for example, the concentration of any of sulfuric acid or copper sulfate is detected in place of the chlorine concentration, and sulfuric acid or copper sulfate is supplied according to the concentration.

The treatments in FIG. 11 may be carried out at any timing, and, for example, may be carried out every time the copper plating treatment by the lot is completed. Alternatively, the treatments may be carried out during the copper plating treatment (real time).

Thus, with the electroplating device 1 of FIG. 10, the plating voltage can be kept at a generally constant level by performing the following control: not the plating voltage but the hydrochloric acid ($Cl^-$) concentration in the base solution is detected, and the hydrochloric acid ($Cl^-$) concentration is kept within the set range.

As a result, also in the second embodiment, it is possible to reduce the probability of hardware troubles in the electroplating device 1 while improving the plating quality.

Up to this point, the invention made by the present inventors was described specifically by way of the embodiments. However, it is naturally understood that the present invention is not limited to the embodiments, and may be variously changeable within the scope not departing from the gist thereof.

The present invention is suitable for the technology of forming wiring and the like using an electroplating method in the manufacturing process of a semiconductor device.

What is claimed is:

1. A method for manufacturing a semiconductor device, the method comprising:
preparing a semiconductor wafer including a plug-embedded interlayer insulation film formed thereover;
forming an insulation film over the interlayer insulation film; forming a wiring trench in a given region of the insulation film by dry etching;
forming a seed film of copper over the insulation film including the wiring trench;
forming a copper plating film over the seed film using an electroplating method by an electroplating device; and
removing the copper plating film and the seed film in a region except for the wiring trench, and forming a wiring of the copper plating film embedded in the wiring trench,
wherein in the forming the copper plating film by the electroplating device, when the semiconductor wafer is immersed in a plating solution to form a copper plating film, a plating voltage applied across an anode and a cathode is detected and a determination is made whether the detected plating voltage falls within a preset set voltage range,
wherein in the determination results, when the plating voltage does not fall within the set voltage range, a concentration of an inorganic component in the plating solution is adjusted so that the voltage value of the plating voltage falls within the set voltage range, and
wherein when the plating voltage is greater than an upper limit value of the set voltage range, pure water is supplied.

2. The method for manufacturing a semiconductor device according to claim 1,
wherein when the plating voltage is greater than the upper limit value of the set voltage range, the concentration of the inorganic component in the plating solution is adjusted so as to increase according to the plating voltage, and wherein in the determination results, when the plating voltage is less than a lower limit value of the set voltage range, the concentration of the inorganic component in the plating solution is adjusted so as to decrease according to the voltage value of the plating voltage.

3. The method for manufacturing a semiconductor device according to claim 2, wherein the concentration adjustment of the inorganic component in the plating solution includes supplying of a hydrochloric acid into the plating solution when the plating voltage is greater than the upper limit value of the set voltage range.

4. The method for manufacturing a semiconductor device according to claim 2, wherein when the plating voltage is less than the lower limit value of the set voltage range, a base solution forming the plating solution is supplied, and wherein the base solution includes copper sulfate, sulfuric acid, and hydrochloric acid.

5. The method for manufacturing a semiconductor device according to claim 1, wherein the concentration adjustment of the inorganic component is performed during the formation of the copper plating film of the semiconductor wafer.

6. The method for manufacturing a semiconductor device according to claim 1, wherein the concentration adjustment of the inorganic component is performed after completion of the treatment of the semiconductor wafer over which a copper plating film is formed upon detecting the plating voltage, and before formation of a copper plating film over another semiconductor wafer.

7. The method of manufacturing a semiconductor device according to claim 1, wherein when the plating voltage is less than a lower limit value of the set voltage range, a calculation of a deficient amount of a base solution is performed.

8. The method of manufacturing a semiconductor device according to claim 1, wherein when the plating voltage is greater than the upper limit value of the set voltage range, a calculation of an excess amount of a base solution is performed.

* * * * *